United States Patent
Kwon et al.

(10) Patent No.: US 12,431,208 B2
(45) Date of Patent: Sep. 30, 2025

(54) MEMORY DEVICE DETECTING DEFECT OF WORD LINE PATH AND OPERATING METHOD THEREOF

(71) Applicant: SAMSUNG ELECTRONICS CO., LTD., Suwon-si (KR)

(72) Inventors: Taehong Kwon, Suwon-si (KR); Daeseok Byeon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/399,018

(22) Filed: Dec. 28, 2023

(65) Prior Publication Data

US 2024/0296898 A1 Sep. 5, 2024

(30) Foreign Application Priority Data

Jan. 30, 2023 (KR) .................. 10-2023-0011856

(51) Int. Cl.
 *G11C 29/00* (2006.01)
 *G11C 29/12* (2006.01)

(52) U.S. Cl.
 CPC .......... *G11C 29/12005* (2013.01); *G11C 29/12015* (2013.01); *G11C 2029/1202* (2013.01)

(58) Field of Classification Search
 None
 See application file for complete search history.

(56) References Cited

U.S. PATENT DOCUMENTS

| | | | |
|---|---|---|---|
| 7,257,038 B2 | 8/2007 | Killian et al. | |
| 7,472,330 B2* | 12/2008 | Jedwab | G11C 11/16 714/763 |
| 8,362,795 B2 | 1/2013 | Kim | |
| 9,698,676 B1* | 7/2017 | Huynh | H02M 3/07 |
| 10,714,205 B1* | 7/2020 | Fang | G11C 29/025 |
| 10,854,250 B2 | 12/2020 | Lee et al. | |
| 11,114,178 B1 | 9/2021 | Eliash et al. | |
| 11,257,559 B1* | 2/2022 | Choi | G11C 16/08 |
| 11,393,790 B2 | 7/2022 | Hiscock et al. | |
| 11,437,117 B2 | 9/2022 | Guo et al. | |
| 2012/0008410 A1* | 1/2012 | Huynh | G11C 29/028 365/185.21 |
| 2013/0229868 A1* | 9/2013 | Koh | G11C 16/10 365/185.03 |
| 2014/0084936 A1* | 3/2014 | Pan | G01R 19/0092 324/509 |

(Continued)

*Primary Examiner* — Mujtaba M Chaudry
(74) *Attorney, Agent, or Firm* — Sughrue Mion, PLLC

(57) ABSTRACT

A memory device includes a memory cell array connected to a plurality of word lines, a clock generator configured to generate a clock signal, a charge pump circuit configured to generate a voltage to be provided to the plurality of word lines, based on the clock signal, a row decoder configured to provide the voltage to a selected memory block, a current generation circuit connected in parallel to a word line path through which the voltage is provided from the charge pump circuit to the row decoder and configured to generate a current flowing through the word line path for a reference time, and a defect detection circuit configured to detect a defect on the word line path by comparing a first count value of the clock signal counted before the reference time with a second count value of the clock signal counted after the reference time.

20 Claims, 13 Drawing Sheets

(56) References Cited

U.S. PATENT DOCUMENTS

| | | | | |
|---|---|---|---|---|
| 2014/0085985 A1* | 3/2014 | Pan | ........................ | G11C 16/06 |
| | | | | 327/536 |
| 2017/0316834 A1* | 11/2017 | Huynh | ................ | G11C 16/3422 |
| 2021/0398602 A1* | 12/2021 | Lakshminarayana Addagalla | ...... | |
| | | | | G11C 16/0483 |
| 2022/0051741 A1* | 2/2022 | Choi | ................ | G11C 29/12015 |

* cited by examiner

MEMORY DEVICE DETECTING DEFECT OF WORD LINE PATH AND OPERATING METHOD THEREOF

CROSS-REFERENCE TO RELATED APPLICATION

This application is based on and claims priority under 35 U.S.C. § 119 to Korean Patent Application No. 10-2023-0011856, filed on Jan. 30, 2023, in the Korean Intellectual Property Office, the disclosure of which is incorporated by reference herein in its entirety.

BACKGROUND

Embodiments are related to a memory device, and more particularly, to a memory device detecting a defect on a word line path and an operating method thereof.

Memory devices may be mainly classified into nonvolatile memories (NVMs), in which data stored therein is retained even when power is not supplied thereto, and volatile memories (VMs), in which data stored therein is lost when power is not supplied thereto.

A memory device includes a plurality of memory cells configured to store data. In order to store data in the memory cells, voltages are applied to the memory cells through various lines or wires.

Voltages applied through word lines may be a relatively high voltage, and the defects of lines or wires due to electromigration (EM) may occur on a word line path to which the high voltage is applied.

SUMMARY

Example embodiments provide a memory device which detects a defect on a word line path by comparing a count value of a clock signal initially provided to a charge pump circuit with a count value of the clock signal provided to the charge pump circuit after a current is provided to the word line path, and an operating method thereof.

According to an aspect of an example embodiment, there is provided a memory device including a memory cell array including memory blocks connected to a plurality of word lines, a clock generator configured to generate a clock signal, a charge pump circuit configured to generate a voltage to be provided to the plurality of word lines, based on the clock signal, a row decoder configured to provide the voltage to generated by the charge pump circuit a memory block selected based on an address, a current generation circuit connected in parallel to a word line path through which the voltage is provided from the charge pump circuit to the row decoder and configured to generate a current flowing through the word line path for a reference time, and a defect detection circuit configured to detect a defect on the word line path by comparing a first count value of the clock signal counted before the reference time with a second count value of the clock signal counted after the reference time.

According to an aspect of an example embodiment, there is provided an operating method of a memory device, the operating method including storing an initial clock count value of a clock signal initially provided to a charge pump circuit of the memory device, providing a current to a word line path from the charge pump circuit to a row decoder of the memory device for a reference time, storing a new clock count value of the clock signal provided to the charge pump circuit after the reference time, and generating a signal indicating a presence or absence of a defect on the word line path by comparing the initial clock count value with the new clock count value.

According to an aspect of an example embodiment, there is provided a memory device including a memory cell array including a plurality of memory cells, a row decoder configured to provide a word line voltage to the memory cell array, a charge pump circuit configured to generate a pumping voltage based on a clock signal and provide the pumping voltage to the row decoder through a word line path, a clock generator configured to generate the clock signal, a current generation circuit configured to provide a current to the word line path for a reference time, a plurality of switches connected in series on the word line path, a counter configured to generate a count value by counting a number of pulses of the clock signal, a first register configured to initially store a first count value of the clock signal, a second register configured to store a second count value of the clock signal after the reference time, and a comparator configured to generate a signal indicating a presence or absence of a defect on the word line path by comparing the first count value with the second count value.

BRIEF DESCRIPTION OF THE DRAWINGS

Embodiments will be more clearly understood from the following detailed description taken in conjunction with the accompanying drawings in which.

DETAILED DESCRIPTION

Hereinafter, various embodiments of the inventive concept will be described with reference to the accompanying drawings.

Figure 1:
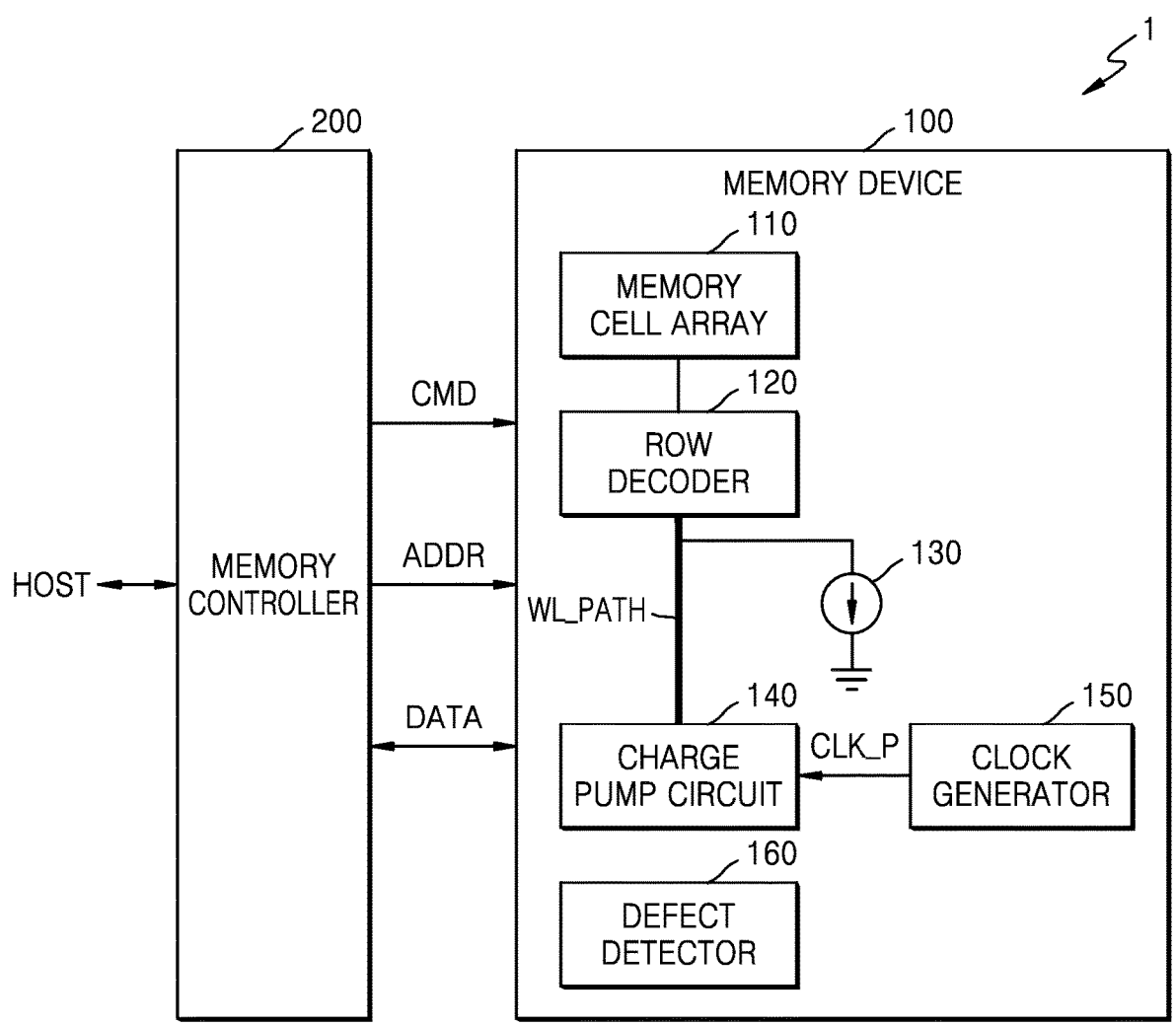
FIG. 1 is a block diagram illustrating a memory system according to an example embodiment.

FIG. 1 is a block diagram illustrating a memory system 1 according to an example embodiment.

Referring to FIG. 1, the memory system 1 may be provided as one of computing systems, such as a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, or a digital video player.

The memory system 1 may include a memory controller 200 and a memory device 100. For example, a host, the memory controller 200, and the memory device 100 may be implemented in a single chip, a single package, or a single module. Alternatively, the memory controller 200 and the memory device 100 may be mounted and provided by using packages, such as a package on package (PoP), a ball grid array (BGA) package, a chip scale package (CSP), a plastic leaded chip carrier (PLCC) package, a plastic dual in-line package (PDIP), a die in waffle pack, a die in wafer form, a chip on board (COB) package, a ceramic dual in-line package (CERDIP), a plastic metric quad flat pack (MQFP), a thin quad flat pack (TQFP), a small outline integrated circuit (SOIC) package, a shrink small outline package (SSOP), a thin small outline package (TSOP), a thin quad flat pack (TQFP), a system in package (SIP), a multi-chip package (MCP), a wafer-level fabricated package (WFP), or a wafer-level processed stack package (WSP).

The memory controller 200 may control the memory device 100 in response to a program request or a read request received from the host HOST. For example, the memory controller 200 may transmit a program command CMD and an address ADDR to the memory device 100 in response to the program request received from the host HOST. The address ADDR, which is transmitted to the memory device 100 by the memory controller 200, may be a physical address of the memory device 100. The memory controller 200 may exchange data DATA with the memory device 100.

The memory device 100 may include a memory cell array 110, a row decoder 120, a current generation circuit 130, a charge pump circuit 140, a clock generator 150, and a defect detector 160.

The memory cell array 110 may include a plurality of memory cells. For example, the plurality of memory cells may be flash memory cells. Hereinafter, embodiments will be described in detail on the assumption that the plurality of memory cells are NAND flash memory cells. However, embodiments of the disclosure not limited thereto, and in another embodiment, the plurality of memory cells may be resistive memory cells, such as resistive random access memory (RAM) (RRAM) cells, phase change RAM (PRAM) cells, or magnetic RAM (MRAM) cells. In some embodiments, the plurality of memory cells may be volatile memory cells. For example, the plurality of memory cells may be dynamic random access memory (DRAM) cells or static random access memory (SRAM) cells.

The memory cell array 110 may be a three-dimensional (3D) memory cell array. The 3D memory cell array is a circuit related to the operations of memory cells and an active area disposed on a silicon substrate, and memory cell arrays having the circuit formed on or inside the silicon substrate are monolithically formed on at least one physical level. The term "monolithically" means that the layers of each level constituting the memory cell array are stacked directly on the layers of each lower level in the memory cell array. The 3D memory cell array includes NAND strings disposed in the vertical direction so that at least one memory cell is above another memory cell. The at least one memory cell may include a charge trap layer. However, embodiments of the disclosure are not limited thereto, and in another embodiment, the memory cell array 110 may be a two-dimensional (2D) memory cell array.

The row decoder 120 may provide a word line voltage to the memory cell array 110. Specifically, the row decoder 120 may select a memory block corresponding to a row address and provide a word line voltage to the selected memory block.

The charge pump circuit 140 may be connected to the row decoder 120 through a word line path WL_PATH. The charge pump circuit 140 may generate a pumping voltage based on a pumping clock signal CLK_P and provide the pumping voltage to the word line path WL_PATH. As the current flowing on the word line path WL_PATH increases, the clock count value of the pumping clock signal CLK_P may increase. As the current flowing on the word line path WL_PATH decreases, the clock count value of the pumping clock signal CLK_P may decrease. That is, when the memory cell array 110 consumes a large amount of power, the charge pump circuit 140 may generate the pumping voltage based on the pumping clock signal CLK_P with a relatively high count value.

The clock generator 150 may generate the pumping clock signal CLK_P based on a system clock signal. Specifically, the clock generator 150 may generate the pumping clock signal CLK_P with a high count value when a large amount of power is consumed through the word line path WL_PATH and may generate the pumping clock signal CLK_P with a low count value when a small amount of power is consumed through the word line path WL_PATH.

The current generation circuit 130 may be connected in parallel to the word line path WL_PATH and may provide a current to the word line path WL_PATH. When the current is provided to the word line path WL_PATH, a defect on the word line path WL_PATH may be accelerated. Specifically, due to the current flowing on the word line path WL_PATH, electromigration (EM) may occur in lines or wires included in the word line path WL_PATH. Due to the EM, an open defect or a short defect may occur in lines or wires included in the word line path WL_PATH. When a short defect occurs, an abnormally large amount of current may flow on the word line path WL_PATH, and when an open defect occurs, an abnormally small amount of current may flow on the word line path WL_PATH. In addition, various circuits may be connected to the word line path WL_PATH.

The defect detector 160 may detect a defect on the word line path WL_PATH. For example, the defect detector 160 may detect a defect on the word line path WL_PATH by using a change in the count value of the pumping clock signal CLK_P. Specifically, after the current is accelerated on the word line path WL_PATH, the defect detector 160 may detect the presence or absence of the defect on the word line path WL_PATH due to acceleration of current by comparing an initial count value of the pumping clock signal CLK_P with a new count value of the pumping clock signal CLK_P. Furthermore, the location of the defect may be detected on the word line path WL_PATH based on an operation of switching a plurality of switches connected in series on the word line path WL_PATH.

According to an example embodiment, the memory device 100 may detect the presence or absence of the defect on the word line path WL_PATH by comparing an initial count value of the pumping clock signal CLK_P before the current is accelerated on the word line path WL_PATH with a new count value of the pumping clock signal CLK_P after the current is accelerated.

That is, the reliability of the memory device 100 may be improved by detecting a vulnerable word line path WL_PATH in advance in a test stage.

Figure 2:
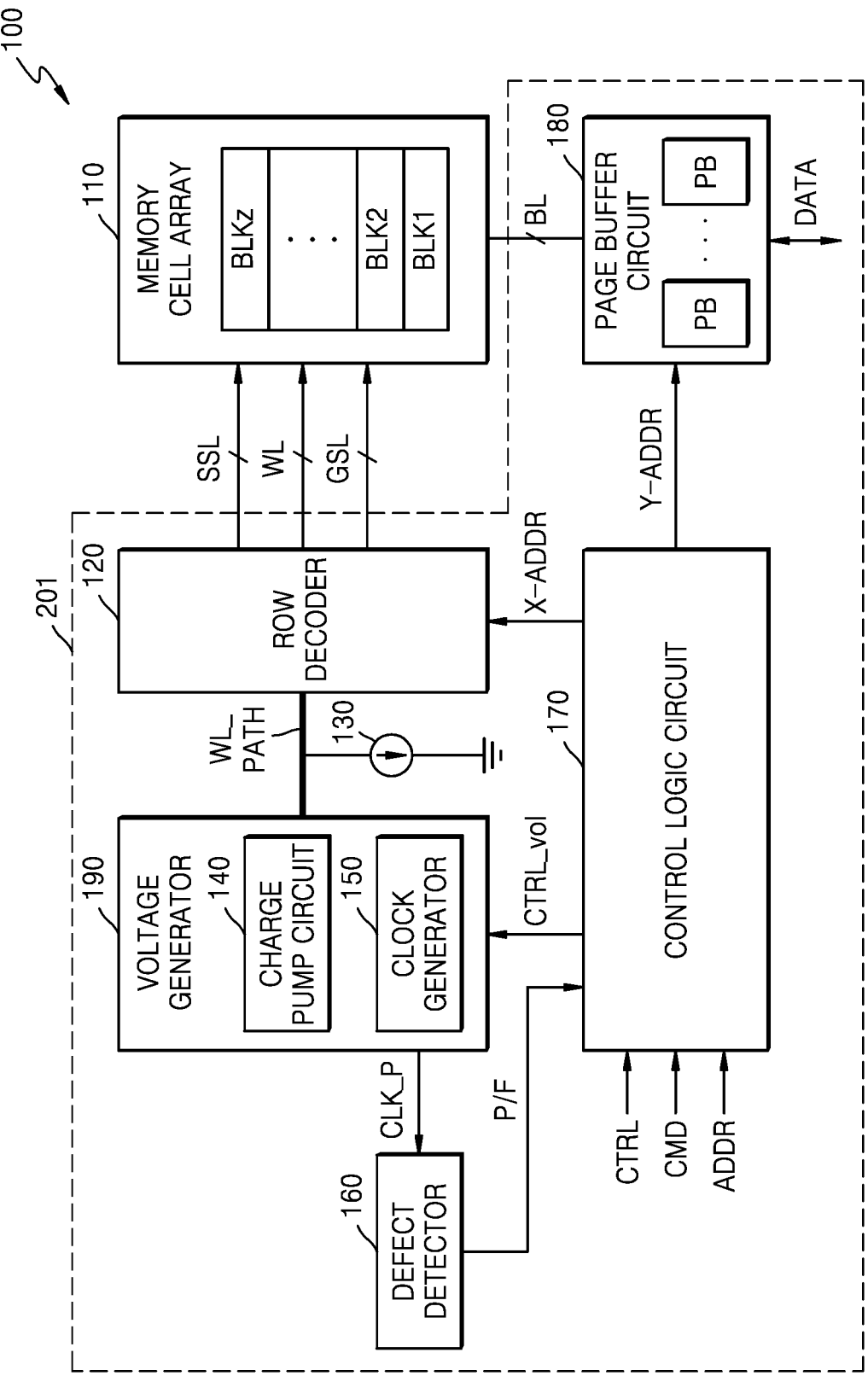
FIG. 2 is a diagram for describing a memory device according to an example embodiment.

FIG. 2 is a diagram for describing a memory device 100 according to an example embodiment.

Referring to FIG. 2, the memory device 100 may include a memory cell array 110 and a peripheral circuit 201. The peripheral circuit 201 may include a voltage generator 190, a control logic circuit 170, a page buffer circuit 180, a row decoder 120, a current generation circuit 130, and a defect detector 160. In FIG. 2, the peripheral circuit 201 may further include various other elements related to memory operation, such as a column logic, a pre-decoder, a temperature sensor, a command decoder, an address decoder, and an input/output interface.

The memory cell array 110 may be connected to the page buffer circuit 180 through bit lines BL and may be connected to the row decoder 120 through word lines WL, string selection lines SSL, and ground selection lines GSL. The memory cell array 110 may include a plurality of memory cells, and the plurality of memory cells may be, for example, flash memory cells. Hereinafter, example embodiments are described in detail on the assumption that the plurality of memory cells are NAND flash memory cells.

The control logic circuit 170 may output various control signals for writing or programming data to the memory cell array 110, verifying the programmed data, reading the data from the memory cell array 110, or erasing the data stored in the memory cell array 110 based on a command CMD, an address ADDR, and a control signal CTRL. Examples of the various control signals may include a voltage control signal CTRL_vol, a row address X-ADDR, and a column address Y-ADDR. Therefore, the control logic circuit 170 may control various operations of the memory device 100.

The voltage generator 190 may generate various types of voltages for performing program, read, and erase operations on the memory cell array 110, based on the voltage control signal CTRL_vol. Specifically, the voltage generator 190 may generate a word line voltage, for example, a program voltage, a read voltage, a pass voltage, an erase verify voltage, or a program verify voltage. In addition, the voltage generator 190 may further generate a string selection line voltage and a ground selection line voltage based on the voltage control signal CTRL_vol.

The voltage generator 190 according to an example embodiment may include a charge pump circuit 140 and a clock generator 150. The charge pump circuit 140 may generate a pumping voltage to be applied to the word line path WL_PATH, based on the pumping clock signal CLK_P generated by the clock generator 150.

The current generation circuit 130 may generate an EM acceleration current to be provided to the word line path WL_PATH. EM may occur on the word line path WL_PATH through the EM acceleration current.

The row decoder 120 may perform an operation of switching the plurality of word lines WL and an operation of switching the plurality of string selection lines SSL in response to the row address X-ADDR. In addition, the page buffer circuit 180 may select at least one bit line from among the bit lines BL in response to the column address Y-ADDR. Each of page buffers PB of the page buffer circuit 180 may operate as a write driver or a sense amplifier according to an operation mode.

The defect detector 160 may generate a pass/fail (P/F) signal indicating the presence or absence of the defect on the word line path WL_PATH, based on the pumping clock signal CLK_P, and may provide the P/F signal to the control logic circuit 170.

Figure 3:
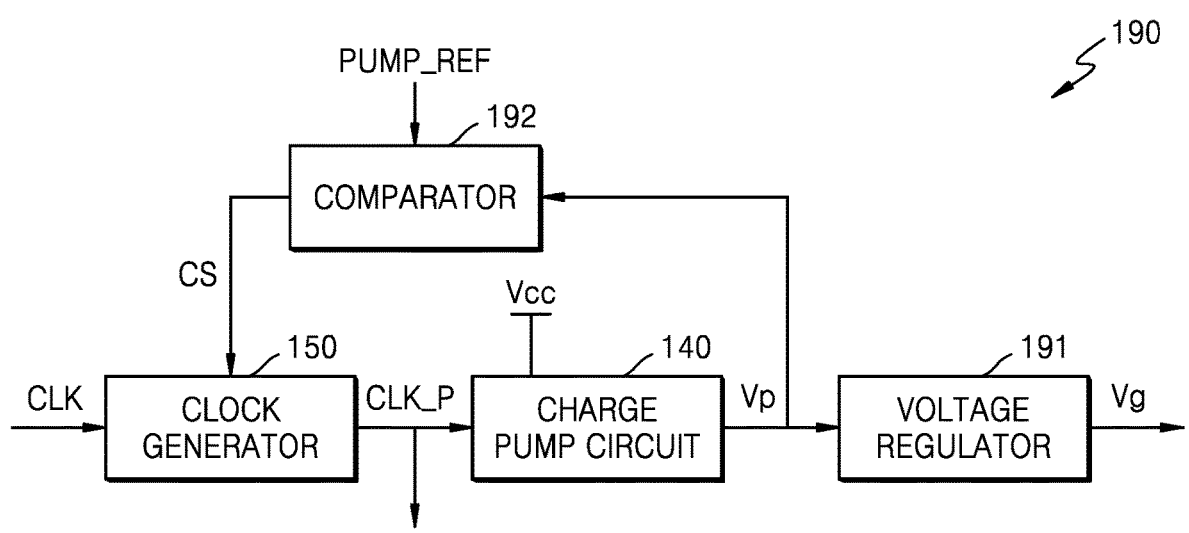
FIG. 3 is a block diagram for describing a voltage generator according to an example embodiment.

FIG. 3 is a block diagram for describing the voltage generator 190 according to an example embodiment.

Referring to FIG. 3, the voltage generator 190 may include a charge pump circuit 140, a clock generator 150, a voltage regulator 191, and a comparator 192.

The clock generator 150 may output a pumping clock signal CLK_P from a system clock signal CLK provided from the outside. Specifically, the clock generator 150 may generate the pumping clock signal CLK_P from the system clock signal CLK by using a comparison signal CS output from the comparator 192 and may output the generated pumping clock signal CLK_P. The pumping clock signal CLK_P may include a plurality of pulses and may include some cycles of the system clock signal CLK. This will be described in detail below.

The charge pump circuit 140 may include a plurality of charge pump circuits and a control circuit. Each of the plurality of charge pump circuits may be enabled or disabled by the control circuit and may perform a charge pumping operation by using a power supply voltage Vcc and the pumping clock signal CLK_P provided from the clock generator 150.

The voltage regulator 191 may generate an operating voltage Vg by regulating a pumping voltage Vp output from the charge pump circuit 140 and may provide the generated operating voltage Vg to the memory cell array (110 of FIG. 2) through the word line path WL_PATH.

The comparator 192 may generate the comparison signal CS by comparing the pumping voltage Vp output from the charge pump circuit 140 with a reference pumping voltage PUMP_REF. The generated comparison signal CS may be provided to the clock generator 150 and used to generate the pumping clock signal CLK_P.

Hereinafter, the process of generating the pumping clock signal CLK_P is described in more detail with reference to FIG. 4.

Figure 4:
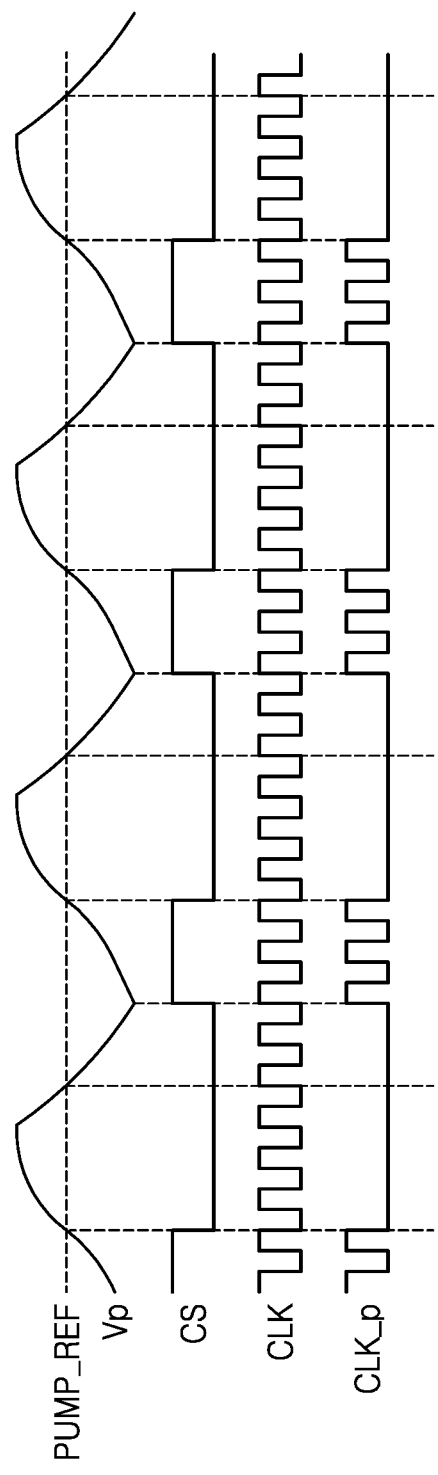
FIG. 4 is a diagram for describing a pumping clock signal of FIG. 3.

FIG. 4 is a diagram for describing the pumping clock signal CLK_P of FIG. 3.

Referring to FIGS. 3 and 4, the comparator 192 may generate the comparison signal CS by comparing the pumping voltage signal Vp output from the charge pump circuit 140 with the reference pumping voltage PUMP_REF. For example, as illustrated in FIG. 4, the comparison signal CS may maintain a logical high level in some periods in which the pumping voltage signal Vp rises and is lower than the reference pumping voltage PUMP_REF, and may maintain a logical low level in the other periods. That is, as illustrated in FIG. 4, the comparison signal CS may be periodically enabled in some periods of the pumping voltage signal Vp.

The comparison signal CS generated by the comparator 192 may be provided to the clock generator 150, and the clock generator 150 may generate the pumping clock signal CLK_P by performing an logical operation (e.g., AND operation) on the system clock signal CLK and the comparison signal CS.

Accordingly, as illustrated in FIG. 4, a pulse-shaped signal may exist in the pumping clock signal CLK_P in some periods in which the charge pump circuit 140 generates the pumping voltage Vp for the generation of the operating voltage Vg, and no pulse-shaped signal may exist in the other periods. The operating voltage Vg may be a voltage to be provided to the word line path WL_PATH.

In the above, an example of the configuration of the voltage generator 190 that generates the operating voltage Vg necessary for the operation of the memory device 100 and generates the pumping clock signal CLK_P by using the system clock signal CLK has been described with reference to FIGS. 3 and 4, but embodiments are not limited thereto. The configuration of the voltage generator 190 may be modified and implemented differently as necessary.

Figure 5:
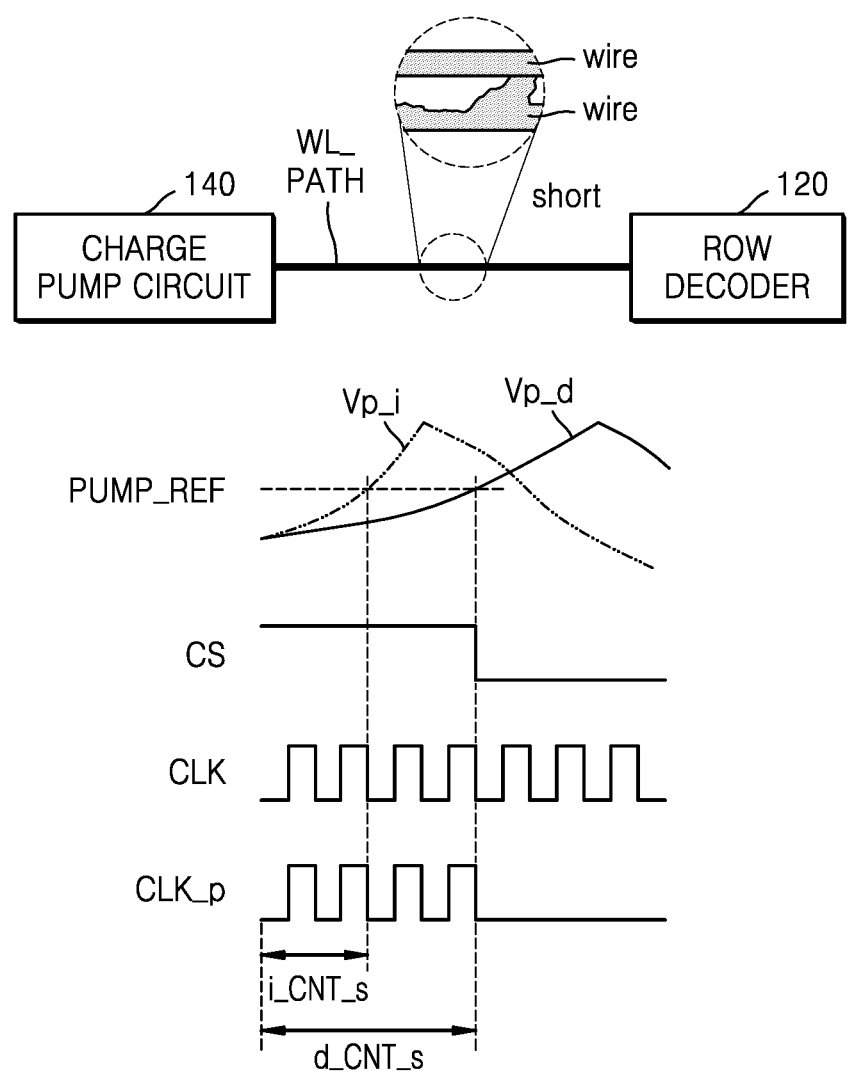
FIG. 5 is a timing diagram for describing a pumping clock signal when a short defect occurs, according to an example embodiment.

FIG. 5 is a timing diagram for describing a pumping clock signal CLK_P when a short defect occurs, according to an example embodiment.

Referring to FIG. 5, the charge pump circuit 140 may initially output an initial pumping voltage signal Vp_i, and the comparator 192 may generate a comparison signal CS by comparing the initial pumping voltage signal Vp_i output from the charge pump circuit 140 with a reference pumping voltage PUMP_REF.

The clock generator 150 may generate the pumping clock signal CLK_P from a system clock signal CLK by using the comparison signal CS output from the comparator 192. Because this has been described above with reference to FIG. 4, a more detailed description thereof is omitted.

Referring to FIGS. 3 and 5, when a short defect is present on the word line path WL_PATH, the charge pump circuit 140 may generate a defect pumping voltage signal Vp_d. It may take the defective pumping voltage signal Vp_d longer to reach the highest voltage than the initial pumping voltage signal Vp_i because a current leakage occurs due to the short defect on the word line path WL_PATH. That is, due to the short defect, it may take the charge pump circuit 140 longer to generate the required level of voltage.

Accordingly, the period in which the comparison signal CS maintains a logical high level may be longer, as compared with a case in which there is no defect on the word line path WL_PATH. Therefore, the number of pulses in the pumping clock signal CLK_P may increase. For example, in the example of FIG. 5, a new clock count value d_CNT_s may be greater than an initial clock count value i_CNT_s by 2.

The memory device 100 according to the present embodiment may use this principle to detect the short defect on the word line path WL_PATH. For example, if the new clock count value d_CNT_s is greater than the initial clock count value i_CNT_s by 2 or more, a P/F signal indicating the presence of the short defect on the word line path WL_PATH may be output.

A case in which the short defect is detected if the new clock count value d_CNT_s is greater than the initial clock count value i_CNT_s by 2 or more has been described, but embodiments are not limited thereto. For example, the short defect may be detected if the new clock count value d_CNT_s is greater than the initial clock count value i_CNT_s by N or more (where N is a natural number greater than or equal to 1).

Figure 6:
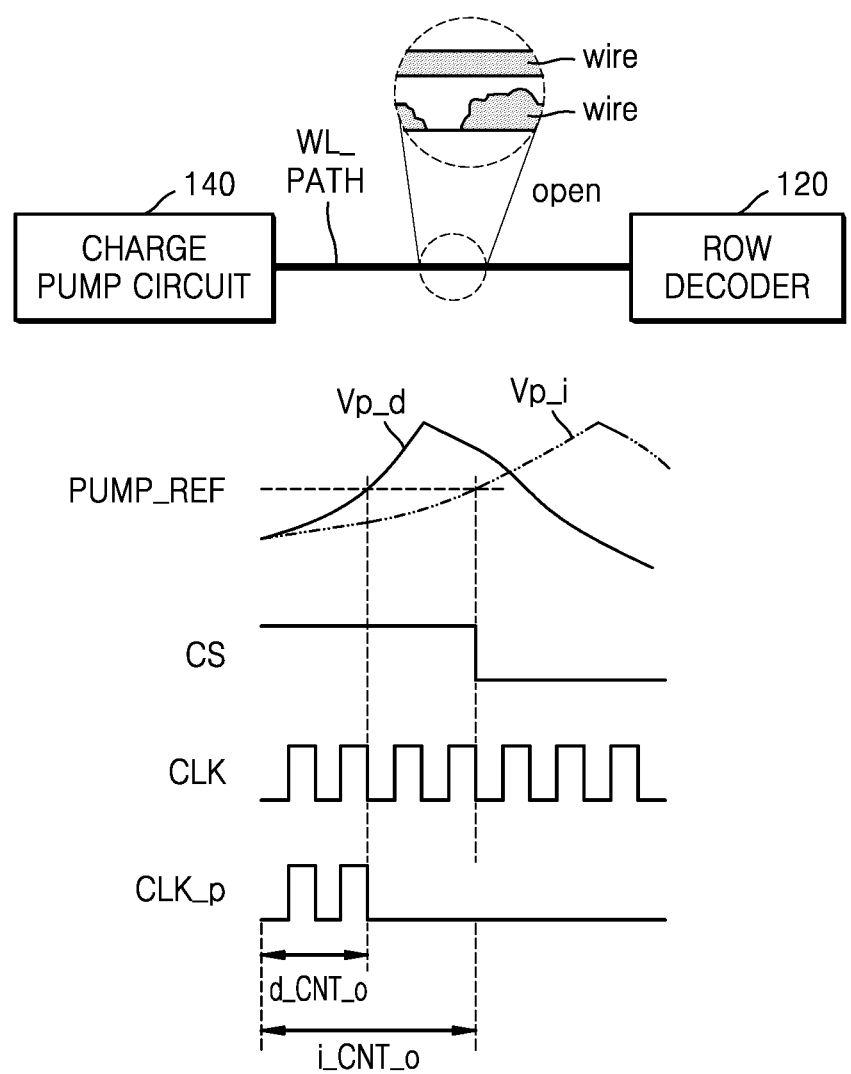
FIG. 6 is a timing diagram for describing a pumping clock signal when an open defect occurs, according to an example embodiment.

FIG. 6 is a timing diagram for describing a pumping clock signal CLK_P when an open defect occurs, according to an example embodiment.

Referring to FIG. 6, the charge pump circuit 140 may initially output an initial pumping voltage signal Vp_i, and the comparator 192 may generate a comparison signal CS by comparing the initial pumping voltage signal Vp_i output from the charge pump circuit 140 with a reference pumping voltage PUMP_REF.

The clock generator 150 may generate the pumping clock signal CLK_P from a system clock signal CLK by using the comparison signal CS output from the comparator 192. Because this has been described above with reference to FIG. 4, a more detailed description thereof is omitted.

Referring to FIGS. 3 and 6, when an open defect is present on the word line path WL_PATH, the charge pump circuit 140 may generate a defect pumping voltage signal Vp_d. It may take the defective pumping voltage signal Vp_d to less time to reach the highest voltage than the initial pumping voltage signal Vp_i because the current flowing through the word line path WL_PATH is reduced due to the open defect on the word line path WL_PATH. That is, due to the open defect, it may take the charge pump circuit 140 much less time to generate the required level of voltage.

Accordingly, the period in which the comparison signal CS maintains a logical high level may be shorter, as compared with a case in which there is no defect on the word line path WL_PATH. Therefore, the number of pulses in the pumping clock signal CLK_P may decrease. For example, in the example of FIG. 6, a new clock count value d_CNT_s may be less than an initial clock count value i_CNT_s by 2.

The memory device 100 according to the present embodiment may use this principle to detect the open defect on the word line path WL_PATH. For example, if the new clock count value d_CNT_s is less than the initial clock count value i_CNT_s by 2 or more, a P/F signal indicating the presence of the open defect on the word line path WL_PATH may be output.

A case in which the open defect is detected if the new clock count value d_CNT_s is less than the initial clock count value i_CNT_s by 2 or more has been described, but embodiments are not limited thereto. For example, the open defect may be detected if the new clock count value d_CNT_s is less than the initial clock count value i_CNT_s by N or more (where N is a natural number greater than or equal to 1).

Figure 7:
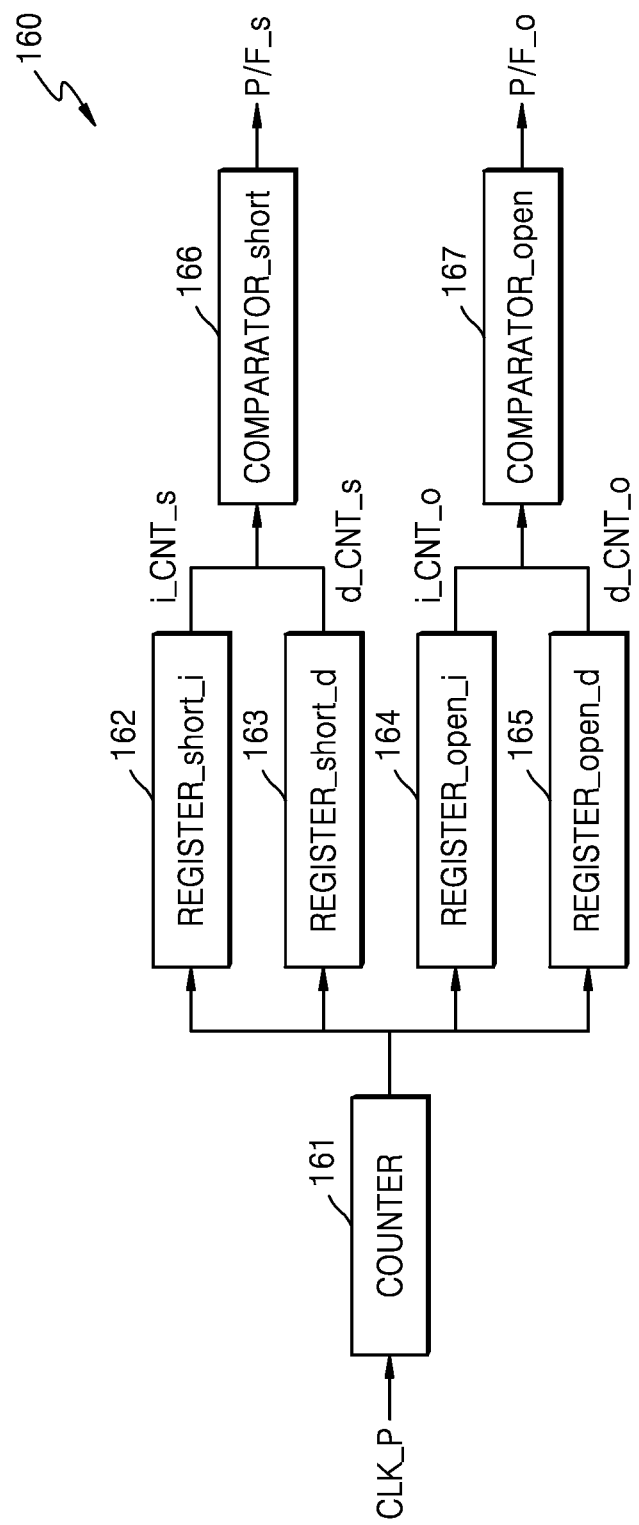
FIG. 7 is a block diagram for describing a defect detector according to an example embodiment.

FIG. 7 is a block diagram for describing the defect detector 160 according to an example embodiment.

Referring to FIG. 7, the defect detector 160 may include a counter 161, first to fourth registers 162 to 165, and first and second comparators 166 and 167.

The counter 161 may receive a pumping clock signal CLK_P and count the number of pulses of the pumping clock signal CLK_P as a clock count value. The counter 161 may store the clock count value in the first to fourth registers 162 to 165. Specifically, the counter 161 may store, in the first register 162, an initial clock count value i_CNT_s for detecting a short defect. The counter 161 may store, in the second register 163, a new clock count value d_CNT_s for detecting a short defect. The counter 161 may store, in the third register 164, an initial clock count value i_CNT_o for detecting an open defect. The counter 161 may store, in the fourth register 165, a new clock count value i_CNT_o for detecting an open defect.

The first comparator 166 may compare the initial clock count value i_CNT_s with the new clock count value d_CNT_s in order to output a P/F signal P/F_s indicating the presence or absence of the short defect. When the new clock count value d_CNT_s is greater than the initial clock count value i_CNT_s by N or more (where N is a natural number), the first comparator 166 may generate the P/F signal P/F_s indicating the presence of the short defect.

The second comparator 167 may compare the initial clock count value i_CNT_o with the new clock count value d_CNT_o in order to output a P/F signal P/F_o indicating the presence or absence of the open defect. When the new clock count value d_CNT_o is less than the initial clock count value i_CNT_o by N or more (where N is a natural number), the second comparator 167 may generate the P/F signal P/F_o indicating the presence of the open defect.

Figure 8:
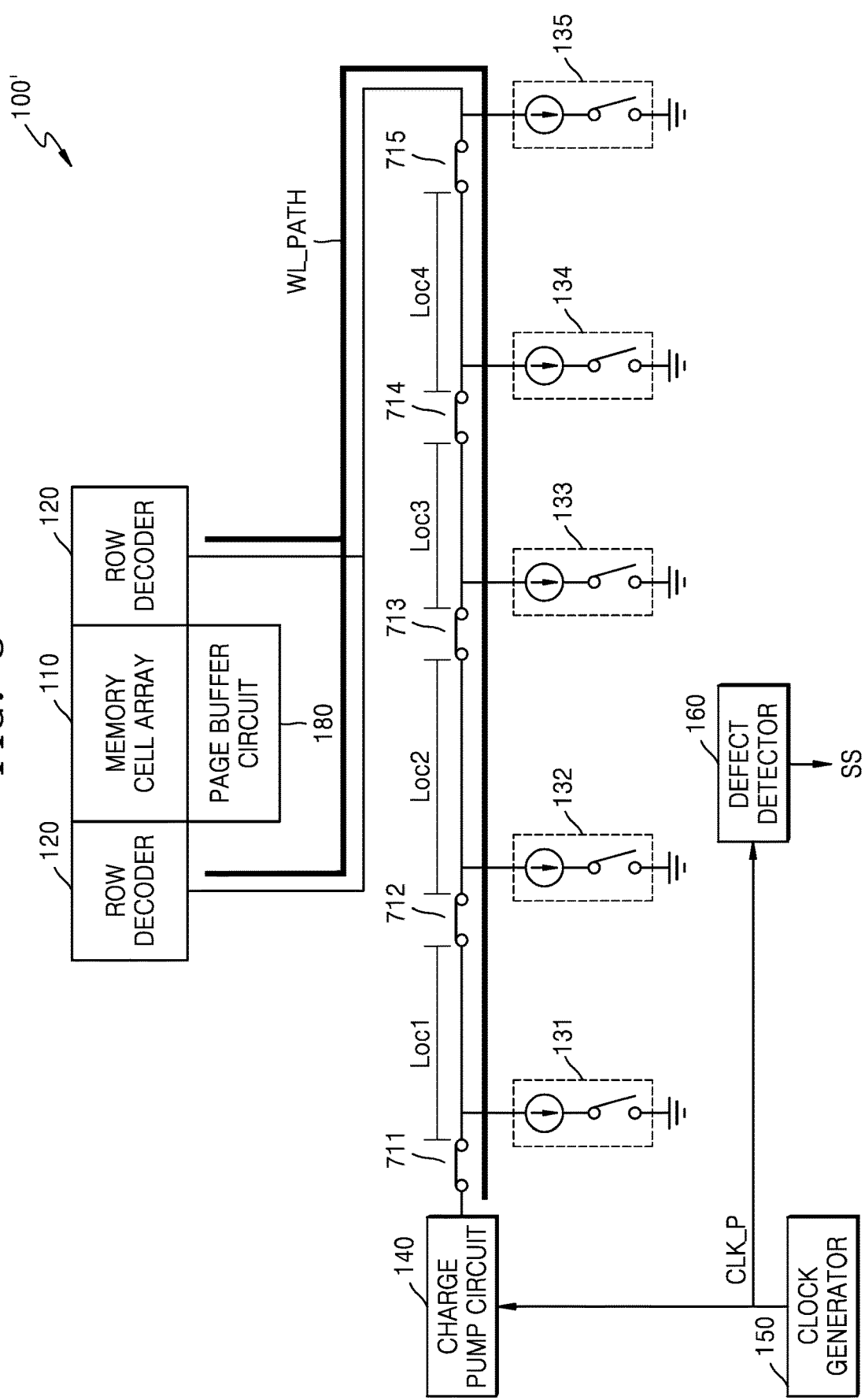
FIG. 8 is a diagram for describing a memory device according to an example embodiment.

FIG. 8 is a diagram for describing a memory device 100' according to an example embodiment. The description provided above with reference to FIG. 2 may be omitted and may also be applied to the description of FIG. 8.

The memory device 100' may include first to fifth switches 711, 712, 713, 714 and 715 connected in series on a word line path WL_PATH. The memory device 100' may include first to fifth current generation circuits 131, 132, 133, 134 and 135 connected in parallel to the word line path WL_PATH. The current generation circuit 130 of FIG. 2 may include at least one of the first to fifth current generation circuits 131 to 135. The word line path WL_PATH may be divided into first to fourth locations Loc1 to Loc4 by the first to fifth switches 711 to 715. Although the first to fifth current generation circuits 131 to 135 are illustrated individually, the first to fifth current generation circuits 131 to 135 may be implemented as a single circuit.

The defect detector 160 may switch the first to fifth switches 711 to 715 through a switching signal SS and enable the first to fifth current generation circuits 131 to 135. The defect detector 160 may detect the presence or absence of the defect on the word line path WL_PATH and the location of the defect, based on the switching signal SS.

Specifically, in a short defect detection operation, the defect detector 160 may turn off the first to fifth switches 711 to 715, disable all the first to fifth current generation circuits 131 to 135, and obtain an initial clock count value i_CNT_s. That is, the defect detector 160 may obtain, as the initial clock count value i_CNT_s, the number of pulses of the pumping clock signal CLK_P provided to the charge pump circuit 140 when there is substantially no power consumed by the word line path WL_PATH.

For EM acceleration, the defect detector 160 may provide the current to the word line path WL_PATH by turning on the first to fifth switches 711 to 715 and enabling the fifth current generation circuit 135. Because the current is provided to the word line path WL_PATH, the EM on the word line path WL_PATH may be accelerated. In some embodiments, the first to fourth current generation circuits 131 to 134 may be selectively enabled in order to accelerate the EM of the word line path WL_PATH. The current on the word line path WL_PATH may flow from the charge pump circuit 140 to at least one of the first to fifth current generation circuits 131 to 135.

In the short defect detection operation, the defect detector 160 may turn on the first to fifth switches 711 to 715, disable the first to fifth current generation circuits 131 to 135, and obtain a new clock count value d_CNT_s. When the short defect occurs on the word line path WL_PATH, the current may flow on the word line path WL_PATH even when the first to fifth current generation circuits 131 to 135 is disabled. Therefore, the new clock count value d_CNT_s may be greater than the initial clock count value i_CNT_s.

When the new clock count value d_CNT_s is greater than the initial clock count value i_CNT_s by N or more (where N is a natural number), the defect detector 160 may generate a P/F signal indicating the presence of the short defect.

Furthermore, the defect detector 160 may detect the location of the short defect through the operation of switching the first to fifth switches 711 to 715.

Specifically, the defect detector 160 may detect the presence or absence of the short defect in the fourth location Loc 4 by turning off the fourth switch 714 and turning on the first to third switches 711 to 713. When no short defect is detected, the existing short defect is present in the fourth location Loc4, and thus, the defect detector 160 may provide, to the control logic circuit 170, a signal indicating the fourth location Loc4.

In a case in which the short defect is detected when the fourth switch 714 is turned off, the defect detector 160 may detect the presence or absence of the short defect in the third location Loc 3 by turning off the third switch 713 and turning on the first and second switches 711 and 172. When no short defect is detected, the existing short defect is present in the third location Loc3, and thus, the defect detector 160 may provide, to the control logic circuit 170, a signal indicating the third location Loc3.

Similarly, the defect detector 160 may detect at which of the first to fourth locations Loc1 to Loc4 the short defect has occurred on the word line path WL_PATH and may provide a signal for the location of the defect to the control logic circuit 170.

In an open defect detection operation, the defect detector 160 may turn on the first to fifth switches 711 to 715, enable the fifth current generation circuit 135, and obtain an initial clock count value i_CNT_o. The defect detector 160 may enable the fifth current generation circuit 135 for an initial time. When the current flows on the word line path WL_PATH for the initial time before EM acceleration, the defect detector 160 may obtain, as the initial clock count value i_CNT_o, the number of pulses of the pumping clock signal CLK_P provided to the charge pump circuit 140. Because the initial clock count value i_CNT_o is obtained in a state in which the current flows on the word line path WL_PATH, the initial clock count value i_CNT_o may be relatively great.

During EM acceleration, the defect detector 160 may provide the current to the word line path WL_PATH by turning on the first to fifth switches 711 to 715 and enabling the fifth current generation circuit 135 for the reference time. Because the current is provided to the word line path WL_PATH for the reference time, the EM on the word line path WL_PATH may be accelerated. The first to fourth current generation circuits 131 to 134 may be selectively enabled in order to accelerate the EM of the word line path WL_PATH.

In the open defect detection operation, the defect detector 160 may turn on the first to fifth switches 711 to 715 for a reference time, enable the fifth current generation circuit 135 for the detection time after the reference time, and obtain a new clock count value d_CNT_o. When the open defect occurs on the word line path WL_PATH, the current may not flow on the word line path WL_PATH even when the fifth current generation circuit 135 is enabled for the detection time. Therefore, the new clock count value d_CNT_o may be less than the initial clock count value i_CNT_o.

When the new clock count value d_CNT_o is less than the initial clock count value i_CNT_o by N or more (where N is a natural number), the defect detector 160 may generate a P/F signal indicating the presence of the open defect. When the new clock count value d_CNT_o is less than the initial count value i_CNT_o by N or more (where N is a natural number), the open defect may be present in at least one of the first to fourth locations Loc1 to Loc4.

Furthermore, the defect detector 160 may detect the location of the open defect through the operation of switching the first to fifth switches 711 to 715 and the operation of enabling the first to fifth current generation circuits 131 to 135.

Specifically, the defect detector 160 may detect the presence or absence of the open defect in the fourth location Loc4 by turning off the fifth switch 715 turning on the first to fourth switches 711 to 714, and enabling the fourth current generation circuit 134. When no open defect is detected, the existing open defect is present in the fourth location Loc4, and thus, the defect detector 160 may provide, to the control logic circuit 170, a signal indicating the fourth location Loc4.

When the open defect is detected even when the fifth switch 715 is turned off and the fourth current generation circuit 134 is enabled, the defect detector 160 may detect the presence or absence of the open defect in the third location Loc3 by turning off the fourth switch 714, turning on the first to third switches 711 to 173, and enabling the third current generation circuit 133. When no open defect is detected, the existing open defect is present in the third location Loc3, and thus, the defect detector 160 may provide, to the control logic circuit 170, a signal indicating the third location Loc3.

Similarly, the defect detector 160 may detect at which of the first to fourth locations Loc1 to Loc4 the open defect has occurred on the word line path WL_PATH and may provide a signal for the location of the defect to the control logic circuit 170.

Figure 9:
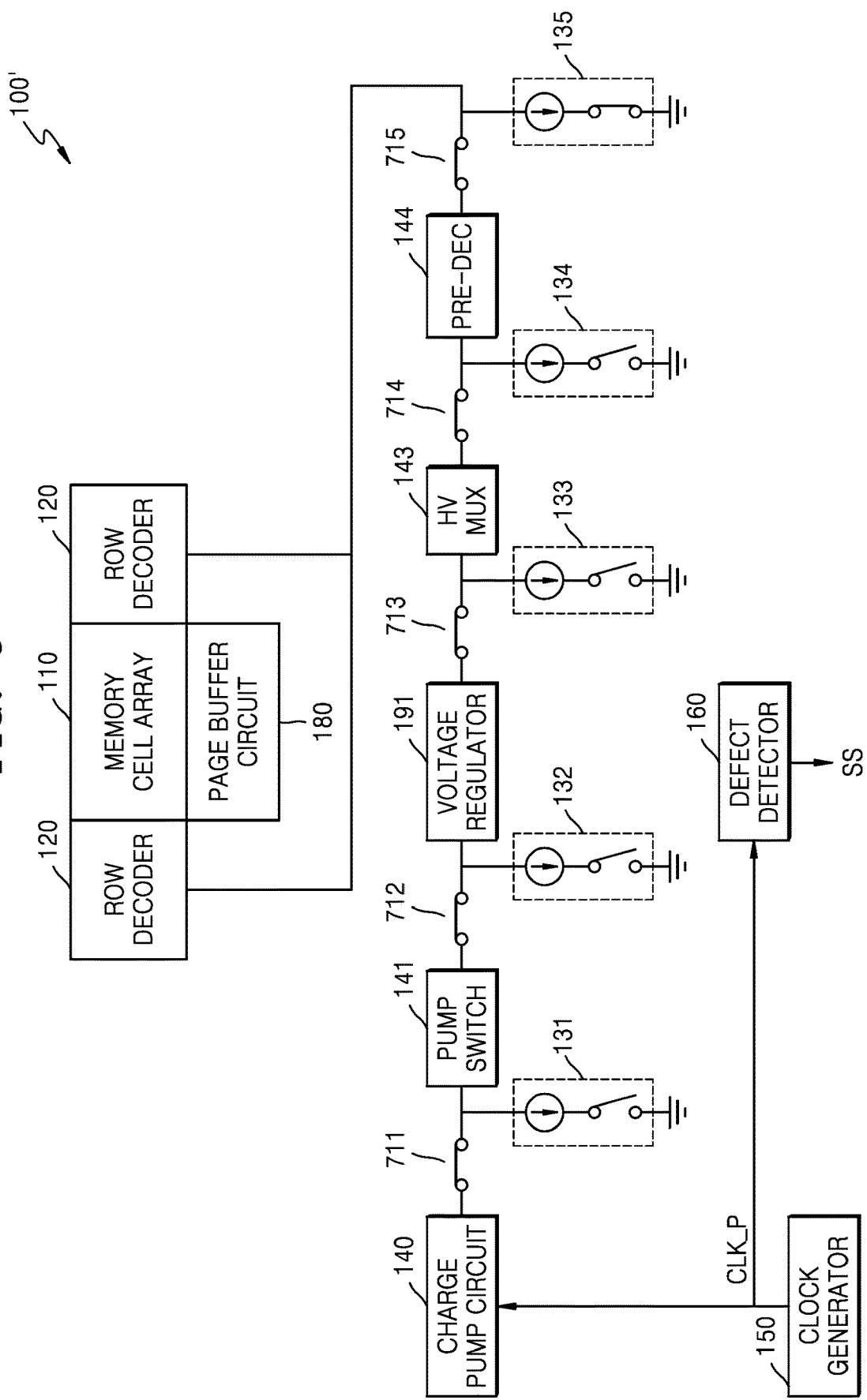
FIG. 9 is a block diagram for describing a memory device according to an example embodiment.

FIG. 9 is a block diagram for describing a memory device 100' according to an example embodiment.

Referring to FIGS. 8 and 9, a pump switch 141 may be disposed at a first location Loc1 of a word line path WL_PATH, a voltage regulator 191 may be disposed at a second location Loc2 of the word line path PATH, a high voltage selection circuit 143 may be disposed at a third location Loc3 of the word line path WL_PATH, and a pre-decoder 144 may be disposed at a fourth location Loc4 of the word line path WL_PATH.

The pump switch 141 may selectively provide, to the voltage regulator 191, a pumping voltage Vp generated by a charge pump circuit 140.

The high voltage selection circuit 143 may selectively provide, to the pre-decoder 144, a voltage generated by the voltage regulator 191.

The pre-decoder 144 may provide, to a row decoder 120, a voltage received from the high voltage selection circuit 143.

Figure 10:
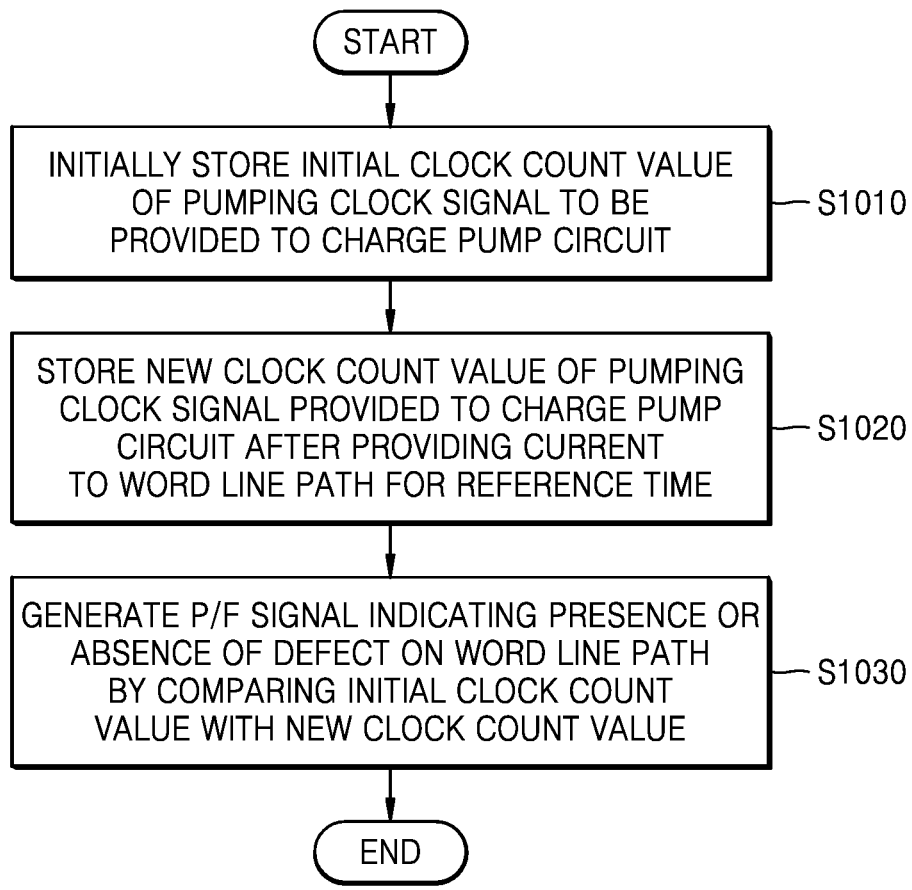
FIG. 10 is a flowchart for describing an operating method of a memory device, according to an example embodiment.

FIG. 10 is a flowchart for describing an operating method of a memory device, according to an embodiment. FIG. 10 may be described below with reference to FIG. 1, 2, or 8.

Referring to FIG. 10, the memory device 100 may initially store the initial clock count value of the pumping clock signal CLK_P to be provided to the charge pump circuit 140 (S1010). In some embodiments, in the short defect detection operation, the memory device 100 may obtain the initial clock count value in a state in which the first to fifth switches 711 to 715 connected in series on the WL path are turned off. In some embodiments, in the open defect detection operation, the memory device 100 may obtain the initial clock count value in a state in which the first to fifth switches 711 to 715 are turned on and the fifth current generation circuit 135 is enabled.

For EM acceleration, the memory device 100 may provide the current to the word line path WL_PATH for the reference time and may store the new clock count value of the pumping clock signal CLK_P provided to the charge pump circuit 140 after the elapse of the reference time (S1020). Specifically, during EM acceleration, the memory device 100 may turn on the first to fifth switches 711 to 715 and enable the fifth current generation circuit 135 for the reference time. In some embodiments, at least one of the first to fourth current generation circuits 131 to 134 may be enabled for the reference time. After that, in some embodiments, in the short defect detection operation, the memory device 100 may obtain the new clock count value in a state in which the fifth switch 715 is turned off and all the first to fourth switches 711 to 714 are turned on. In some embodiments, in the open defect detection operation, the memory device 100 may obtain the new clock count value in a state in which the first to fifth switches 711 to 715 are turned on and the fifth current generation circuit 135 is enabled.

The memory device 100 may generate the P/F signal indicating the presence or absence of the defect on the lines or wires included in the word line path WL_PATH by comparing the initial clock count value with the new clock count value (S1030). In the short defect detection operation, when the new clock count value is greater than the initial clock count value by N or more (where N is a natural number), the P/F signal may indicate the presence of the short defect. In the short defect detection operation, when the new clock count value is less than the initial clock count value by N or more (where N is a natural number), the P/F signal may indicate the presence of the open defect.

In some embodiments, the memory device 100 may detect the location of the defect based on the operation of switching the first to fifth switches 711 to 715 and the operation of enabling the first to fifth current generation circuits 131 to 135. For example, the memory device 100 may turn off the first to fourth switches 711 to 714 in the order of distance from the charge pump circuit 140, may obtain the new clock count value whenever each switch is turned off, and may detect the location of the defect by comparing the obtained clock count value with the initial clock count value.

Figure 11:
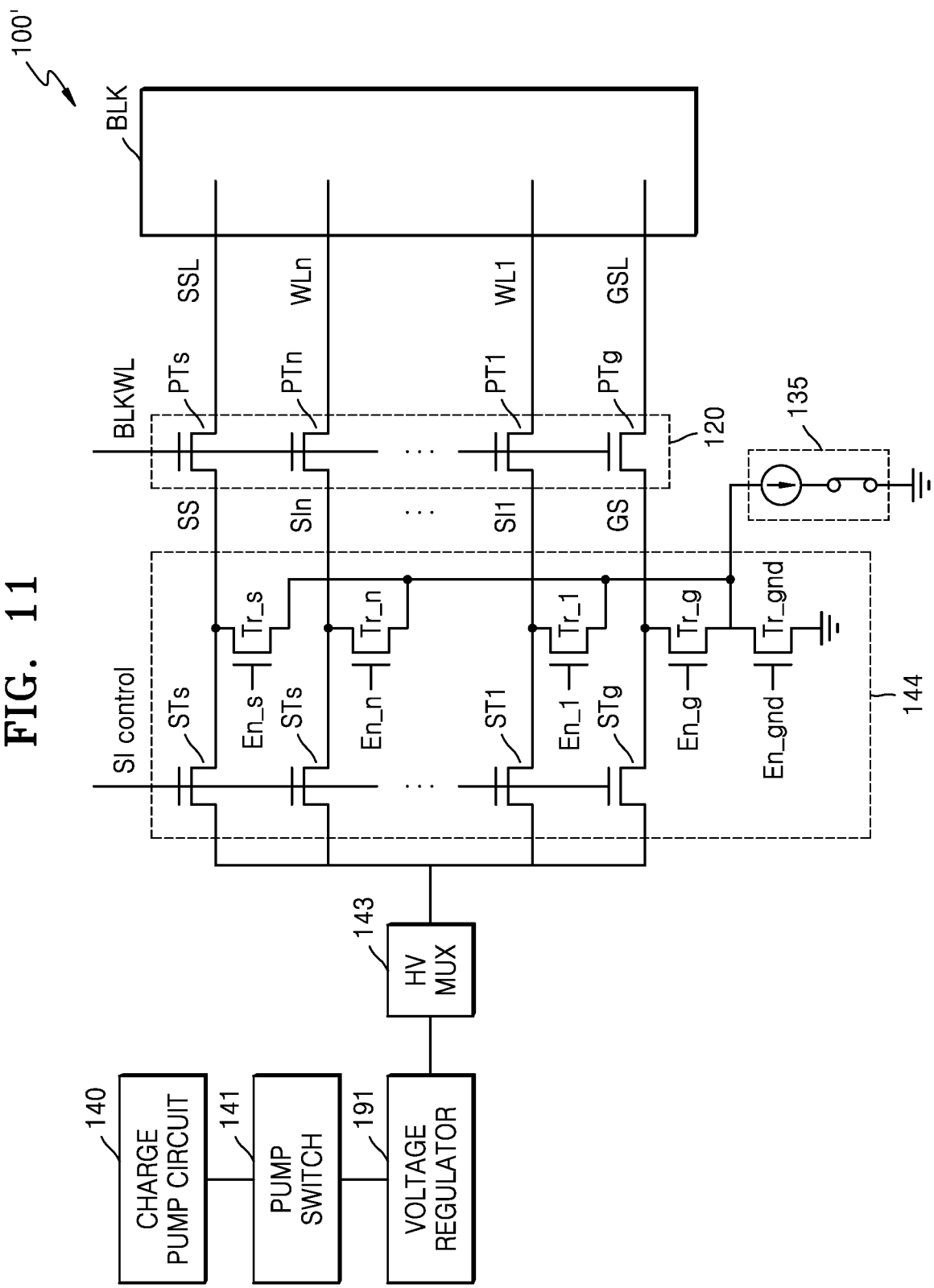
FIG. 11 is a diagram for describing a memory device according to an example embodiment.

FIG. 11 is a diagram for describing a memory device 100 according to an embodiment.

Referring to FIG. 11, the row decoder 120 may include a plurality of pass transistors PTg, PT1 to PTn, and PTs. Because the plurality of pass transistors PTg, PT1 to PTn, and PTs are turned on in response to a block selection signal BLKWL, voltages received through the plurality of signal lines GS, SI1 to SIn, and SS may be provided to a memory block BLK through a ground selection line GSL, a plurality of word lines WL1 to WLn, and a string selection line SSL.

A pre-decoder 144 may include a plurality of signal selection transistors STg, ST1 to STn, and STs. The plurality of signal selection transistors STg, ST1 to STn, and STs may be turned on in response to a signal selection signal (SI control) and provide, to the plurality of signal lines GS, SI1 to SIn, and SS, a voltage received from a high voltage selection circuit 143.

The pre-decoder 144 may include a plurality of enable transistors Tr_gnd, Tr_g, TR_1 to TR_n, and Tr_s connected to the plurality of signal lines GS, SI1 to SIn, and SS. The plurality of enable transistors Tr_gnd, Tr_g, TR_1 to TR_n, and Tr_s may be turned on in response to a plurality of enable signals En_gnd, En_g, En1 to En_n, and En_s and connected to a fifth current generation circuit 135. The enable transistor Tr_gnd may be connected to one end of each of the plurality of enable transistors Tr_g, TR_1 to TR_n, and Tr_s and may discharge the plurality of signal lines GS, SI1 to SIn, and SS according to the enable signal En_gnd.

The fifth current generation circuit 135 may be connected to one end of each of the plurality of enable transistors Tr_g, TR_1 to TR_n, and Tr_s and may provide the current to the plurality of signal lines GS, SI1 to SIn, and SS.

Figure 12:
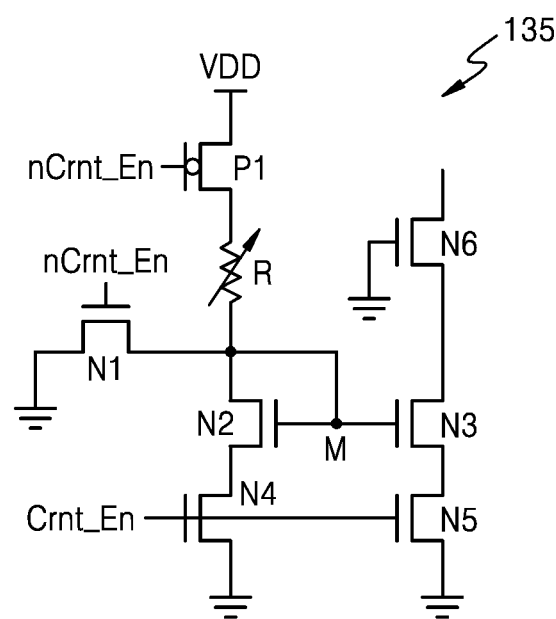
FIG. 12 is a circuit diagram for describing a current generation circuit according to an example embodiment.

FIG. 12 is a circuit diagram for describing the fifth current generation circuit 135 according to an example embodiment.

Referring to FIG. 12, the fifth current generation circuit 135 is illustrated, but embodiments are not limited thereto. For example, at least one of the first to fourth current generation circuits 131 to 134 may have the same structure as the fifth current generation circuit 135.

The fifth current generation circuit 135 may include a P-type transistor P1, N-type transistors N1, N2, N3, N4, N5 and N6, and a variable resistor R. A drain terminal of the N-type transistor N6 may be connected to source terminals of the plurality of enable transistors Tr_g, TR_1 to TR_n, and Tr_s of FIG. 11. The N-type transistor N6 may operate in a depletion mode and may be turned on by applying a ground voltage to a gate terminal of the N-type transistor N6. For example, a threshold voltage of the N-type transistor N6 may have a negative level. When a relatively high voltage (e.g., 20 V) is provided to the N-type transistor N6 through the drain terminal thereof, the N-type transistor N6 may protect the N-type transistor N3 from the relatively high voltage by providing a relatively low voltage (e.g., 2V) through a source terminal thereof. In some embodiments, the N-type transistor N6 may be a metal-oxide semiconductor field effect transistor (MOSFET) having a relatively thick insulating layer.

When a current enable signal Crnt_En is at a logic low level, an inverted current enable signal nCrnt_En is at a logic high level. Therefore, the P-type transistor P1 and the N-type transistors N4, and N5 may be turned off. In addition, because a node M is discharged by the N-type transistor N1, the N-type transistors N2 and N3 may be turned off. Therefore, the fifth current generation circuit 135 may not operate as a current mirror.

When the current enable signal Crnt_En is at a logic high level, the inverted current enable signal nCrnt_En is at a logic low level. Therefore, the N-type transistor N1 may be turned off and the P-type transistor P1 and the N-type transistors N4 and N5 may be turned on. A power supply voltage VDD drops by a voltage applied to the variable resistor R, and the dropped voltage may be applied to the node M. Therefore, the N-type transistors N2 and N3 may be turned on. That is, the fifth current generation circuit 135 may operate as a current mirror and may provide a constant current to the plurality of signal lines GS, SI1 to SIn, and SS.

Figure 13:
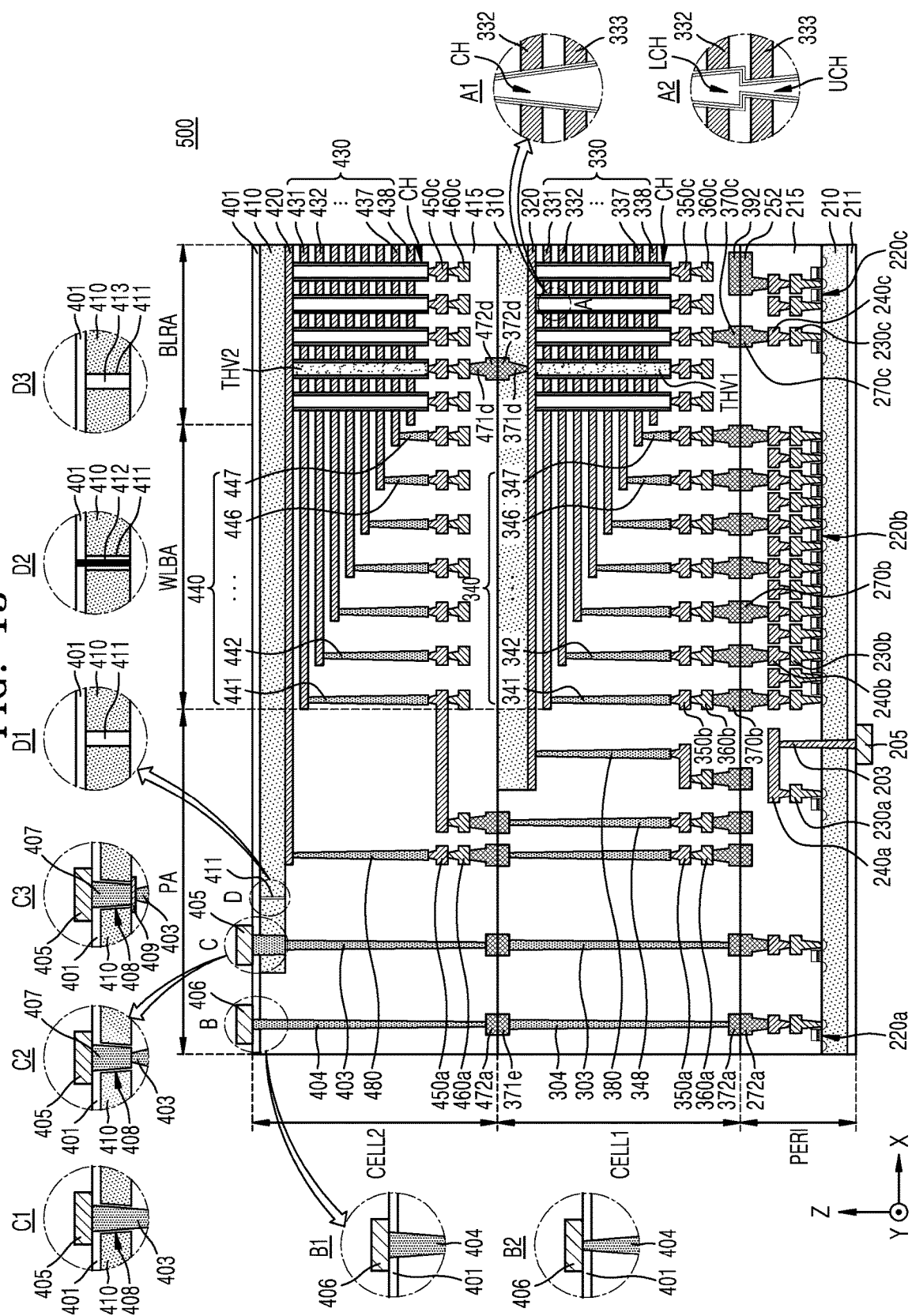
FIG. 13 is a diagram for describing a memory device according to an example embodiment.

FIG. 13 is a view illustrating a memory device 500 according to one or more example embodiments.

Referring to FIG. 13, the memory device 500 may have a chip-to-chip (C2C) structure. At least one upper chip, which includes a cell region, and a lower chip, which includes a peripheral circuit region PERI, may be manufactured separately, and then, the at least one upper chip and the lower chip may be connected to each other by a bonding method to realize the C2C structure. For example, the bonding method may be a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 13, the memory device 500 may include two upper chips. However, the number of upper chips is not limited thereto. In the case in which the memory device 500 includes the two upper chips, a first upper chip including a first cell region CELL1, a second upper chip including a second cell region CELL2, and the lower chip including the peripheral circuit region PERI may be manufactured separately, and then, the first upper chip, the second upper chip, and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on the +Z-axis direction, and the upper portion of each of the first and second upper chips may mean an upper portion defined based on the −Z-axis direction in FIG. 13. However, embodiments of the disclosure are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of the disclosure are not limited thereto. In certain embodiments, at least one additional metal line may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity that is lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331, 332, . . . 337, 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH, which are formed by the processes performed sequentially.

In the case in which the channel structure CH includes the lower channel LCH and the upper channel UCH as illustrated in the region 'A2', a word line located near to the boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus, it is possible to reduce an influence of a non-uniform channel width between the lower and upper channels LCH and UCH on an operation of the memory device 500.

The number of lower word lines 331 and 332 penetrated by the lower channel LCH is less than the number of upper word lines 333 to 338 penetrated by the upper channel UCH in the region 'A2'. However, embodiments of the disclosure are not limited thereto. In certain embodiments, the number of lower word lines penetrated by the lower channel LCH may be equal to or more than the number of upper word lines penetrated by the upper channel UCH. In addition, structural features and the connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 13, the first through-electrode THV1 may penetrate the common source line 320 and the plurality of word lines 330. In certain embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer, and the bit line 360c may be electrically connected to the circuit elements 220c constituting the page buffer through an upper bonding metal pattern 370c of the first cell region CELL1 and an upper bonding metal pattern 270c of the peripheral circuit region PERI.

Referring continuously to FIG. 13, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341, 342, ... 346, 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may constitute the row decoder, and the cell contact plugs 340 may be electrically connected to the circuit elements 220b constituting the row decoder through the upper bonding metal patterns 370b of the first cell region CELL1 and the upper bonding metal patterns 270b of the peripheral circuit region PERI. In some embodiments, an operating voltage of the circuit elements 220b constituting the row decoder may be different from an operating voltage of the circuit elements 220c constituting the page buffer. For example, the operating voltage of the circuit elements 220c constituting the page buffer may be greater than the operating voltage of the circuit elements 220b constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441, 442, ... 446, 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of aluminum, copper, or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405 and 406 may be disposed in the external pad bonding region PA. Referring to FIG. 13, a lower insulating layer 211 may cover a bottom surface of the first substrate 210, and a first input/output pad 205 may be formed on the lower insulating layer 211. The first input/output pad 205 may be connected to at least one of a plurality of the circuit elements 220a disposed in the peripheral circuit region PERI through a first input/output contact plug 203 and may be separated from the first substrate 210 by the lower insulating layer 211. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the disclosure are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

In some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the disclosure are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

In certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

The memory cell array 110 of FIG. 2 may be disposed on the first cell region CELL1 and/or the second cell region CELL2. The peripheral circuit 201 of FIG. 2 may be disposed on the peripheral circuit region PERI.

While certain example embodiments have been particularly shown and described, it will be understood that various changes in form and details may be made therein without departing from the spirit and scope of the following claims.

What is claimed is:

1. A memory device comprising:
   a memory cell array comprising a memory block connected to a plurality of word lines;
   a clock generator configured to generate a clock signal;

a charge pump circuit configured to generate a voltage to be provided to the plurality of word lines, based on the clock signal;

a row decoder configured to provide the voltage generated by the charge pump circuit to the memory block, wherein a word line path comprises an electrical connection from the charge pump circuit through a plurality of switches to the row decoder;

a current generation circuit connected from the word line path to a ground, the current generation circuit being configured to sink a current from the word line path for a reference time; and a defect detection circuit configured to detect a defect on the word line path by comparing a first count value of the clock signal counted before the reference time with a second count value of the clock signal counted after the reference time, wherein the first count value provides a reference value in a no-defect condition, wherein the second count value is higher than the first count value based on the defect being a short circuit defect present in the word line path, and wherein the second count value is lower than the first count value based on the defect being an open circuit defect present in the word line path.

2. The memory device of claim 1, wherein the defect detection circuit comprises:

a first register configured to store the first count value;

a second register configured to store the second count value; and a comparator configured to generate a signal indicating a presence or an absence of the defect by comparing the first count value with the second count value.

3. The memory device of claim 1, wherein the plurality of switches are connected in series between the charge pump circuit and the row decoder on the word line path, wherein the first count value is counted in a first state in which the plurality of switches are turned off, the second count value is counted in a second state in which at least one of the plurality of switches is turned on, and the defect detection circuit is further configured to detect a short defect on the word line path by comparing the first count value with the second count value.

4. The memory device of claim 3, wherein the second count value is greater than the first count value.

5. The memory device of claim 3, wherein, when the defect on the word line path is detected based on the second count value counted in a third state in which a first switch among the plurality of switches is turned off and remaining switches between the charge pump circuit and the first switch are turned on, the defect on the word line path is not detected based on the second count value counted in a fourth state in which a second switch relatively closer to the charge pump circuit than the first switch among the plurality of switches is turned off and remaining switches between the charge pump circuit and the second switch are turned on, and the defect detection circuit is further configured to output a location signal indicating that the short defect has occurred at a location between the first switch and the second switch in the word line path.

6. The memory device of claim 1, wherein the plurality of switches are connected in series between the charge pump circuit and the row decoder on the word line path, the first count value is counted in a first state in which the plurality of switches are turned on and the current generation circuit provides the current to the word line path before the reference time, the second count value is counted in a second state in which at least one of the plurality of switches is turned off and the current generation circuit provides the current to the word line path after the reference time, and the defect detection circuit is further configured to detect an open defect on the word line path by comparing the first count value with the second count value.

7. The memory device of claim 6, wherein the second count value is less than the first count value.

8. The memory device of claim 6, wherein, when the defect on the word line path is detected based on the second count value counted in a third state in which a first switch among the plurality of switches is turned off, remaining switches between the charge pump circuit and the first switch are turned on, and the current is provided to the word line path, the defect on the word line path is not detected based on the second count value counted in a fourth state in which a second switch relatively closer to the charge pump circuit than the first switch among the plurality of switches is turned off, remaining switches between the charge pump circuit and the second switch are turned on, and the current is provided to the word line path, and the defect detection circuit is further configured to output a location signal indicating that the open defect has occurred at a location between the first switch and the second switch in the word line path.

9. The memory device of claim 1, further comprising:

a regulator circuit connected in series to the charge pump circuit through a first switch on the word line path, the regulator circuit being configured to regulate the voltage generated by the charge pump circuit; and a pre-decoder connected in series to the regulator circuit through a second switch on the word line path, having an output terminal connected to the current generation circuit, the pre-decoder being configured to provide, to the row decoder, a voltage output from the regulator circuit.

10. An operating method of a memory device, the operating method comprising:

storing an initial clock count value of a clock signal initially provided to a charge pump circuit of the memory device;

providing a current to a word line path from the charge pump circuit to a row decoder of the memory device for a reference time, wherein the word line path comprises an electrical connection from the charge pump circuit through a plurality of switches to the row decoder;

storing a new clock count value of the clock signal provided to the charge pump circuit after the reference time; and generating a first signal indicating a presence or an absence of a defect on the word line path by comparing the initial clock count value with the new clock count value, wherein the initial clock count value provides a reference value in a no-defect condition, wherein the new clock count value is higher than the initial clock count value based on the defect being a short circuit defect present in the word line path, and wherein the new clock count value is lower than the initial clock count value based on the defect being an open circuit defect present in the word line path.

11. The operating method of claim 10, wherein the storing the initial clock count value comprises:
turning off the plurality of switches connected in series on the word line path; and
storing, as the initial clock count value, a first clock count value of the clock signal provided to the charge pump circuit after turning off the plurality of switches.

12. The operating method of claim 11, wherein the storing the new clock count value comprises:
turning on the plurality of switches; and
storing, as the new clock count value, a second clock count value of the clock signal provided to the charge pump circuit after turning on the plurality of switches, and
wherein the generating the first signal indicating the presence or the absence of the defect on the word line path comprises generating the first signal indicating a presence or an absence of a short defect on the word line path by comparing the initial clock count value with the new clock count value.

13. The operating method of claim 10, wherein the storing the initial clock count value comprises:
turning on the plurality of switches, wherein the plurality of switches are connected in series on the word line path;
providing the current to the word line path for an initial time before the reference time; and
storing, as the initial clock count value, a clock count value of the clock signal provided to the charge pump circuit for the initial time.

14. The operating method of claim 13, wherein the storing the new clock count value comprises:
turning on the plurality of switches after the reference time;
providing the current to the word line path for a detection time after turning on the plurality of switches; and
storing, as the new clock count value, a third clock count value of the clock signal provided to the charge pump circuit for the detection time, and
wherein the generating the first signal indicating the presence or the absence of the defect on the word line path comprises generating the first signal indicating a presence or an absence of an open defect on the word line path by comparing the initial clock count value with the new clock count value.

15. The operating method of claim 10, further comprising:
obtaining at least two new clock count values after selectively switching the plurality of switches connected in series on the word line path; and
generating a second signal indicating a location of the defect on the word line path by comparing each of the at least two new clock count values with the initial clock count value.

16. A memory device comprising:
a memory cell array comprising a plurality of memory cells connected to a plurality of word lines;
a row decoder configured to provide a word line voltage to the plurality of word lines;
a charge pump circuit configured to generate a pumping voltage based on a clock signal and provide the pumping voltage to the row decoder through a word line path;
a clock generator configured to generate the clock signal;
a current generation circuit configured to provide a current to the word line path for a reference time, wherein the word line path comprises an electrical connection from the charge pump circuit through a plurality of switches to the row decoder;
the plurality of switches connected in series on the word line path;
a counter configured to generate a count value by counting a number of pulses of the clock signal;
a first register configured to initially store a first count value of the clock signal;
a second register configured to store a second count value of the clock signal after the reference time; and
a comparator configured to generate a signal indicating a presence or an absence of a defect on the word line path by comparing the first count value with the second count value,
wherein the first count value provides a reference value in a no-defect condition,
wherein the second count value is higher than the first count value based on the defect being a short circuit defect present in the word line path, and
wherein the second count value is lower than the first count value based on the defect being an open circuit defect present in the word line path.

17. The memory device of claim 16, wherein the first count value is counted in a first state in which the plurality of switches are turned off, and
the second count value is counted in a second state in which at least one of the plurality of switches is turned on.

18. The memory device of claim 17, wherein the second count value is greater than the first count value by a reference count or more.

19. The memory device of claim 16, wherein the first count value is counted in a first state in which the plurality of switches are turned on and the current generation circuit provides the current to the word line path for an initial time before the reference time, and
the second count value is counted in a second state in which at least one of the plurality of switches is turned off and the current generation circuit provides the current to the word line path for a detection time after the reference time.

20. The memory device of claim 19, wherein the second count value is less than the first count value by a reference count or more.

* * * * *